(12) United States Patent
Zhang

(10) Patent No.: US 8,979,579 B2
(45) Date of Patent: Mar. 17, 2015

(54) SIGNAL TEST DEVICE

(71) Applicants: Hong Fu Jin Precision Industry (ShenZhen) Co., Ltd., Shenzhen (CN); Hon Hai Precision Industry Co., Ltd., New Taipei (TW)

(72) Inventor: Hao Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 106 days.

(21) Appl. No.: 13/864,258

(22) Filed: Apr. 17, 2013

(65) Prior Publication Data

US 2014/0213075 A1    Jul. 31, 2014

(30) Foreign Application Priority Data

Jan. 28, 2013    (CN) .......................... 2013 1 0031691

(51) Int. Cl.
   *H01R 13/60* (2006.01)
   *G01R 31/28* (2006.01)

(52) U.S. Cl.
   CPC ....................................... *G01R 31/28* (2013.01)
   USPC .......................... 439/540.1; 439/638; 439/581

(58) Field of Classification Search
   USPC ................................ 439/638, 54, 540.1, 578
   See application file for complete search history.

(56) References Cited

U.S. PATENT DOCUMENTS

| | | | |
|---|---|---|---|
| 4,273,407 A * | 6/1981 | Snuffer et al. ................ | 439/579 |
| 6,468,089 B1 * | 10/2002 | Hubbard et al. ........... | 439/540.1 |
| 6,790,080 B2 * | 9/2004 | Cannon ..................... | 439/540.1 |
| 7,234,967 B2 * | 6/2007 | Weidner et al. ............... | 439/581 |
| 7,253,648 B2 * | 8/2007 | Yang ........................ | 324/754.07 |
| 7,492,061 B2 * | 2/2009 | Beyers et al. ................... | 307/85 |
| 8,113,877 B2 * | 2/2012 | Chang .......................... | 439/578 |
| 8,760,173 B2 * | 6/2014 | Li et al. ...................... | 439/541.5 |
| 2005/0176292 A1 * | 8/2005 | Lee et al. ..................... | 439/578 |
| 2006/0211303 A1 * | 9/2006 | Kodaira et al. ............... | 439/579 |
| 2006/0223365 A1 * | 10/2006 | Campbell .................. | 439/540.1 |
| 2009/0197434 A1 * | 8/2009 | Kressner et al. ................ | 439/63 |

* cited by examiner

*Primary Examiner* — Briggitte R Hammond
(74) *Attorney, Agent, or Firm* — Novak Druce Connolly Bove + Quigg LLP

(57) ABSTRACT

A signal test device includes a metal housing, a circuit board, a protection housing, and a number of fasteners. The circuit board is received in the metal housing. A number of sub-miniature-A (SMA) connectors are mounted to a first side of the circuit board. Each SMA connector includes a base body connected to the circuit board, and a connection head connected to the base body and extending out of the metal housing. An interface is mounted to a second side of the circuit board and extending out of the metal housing. The protection housing is mounted to the second end of the circuit board and is received in the metal housing. The first fasteners extend through and fastened to the base bodies and the circuit board. Opposite ends of each first fastener abut against top and bottom of the inner surface of the metal housing.

7 Claims, 4 Drawing Sheets

SIGNAL TEST DEVICE

BACKGROUND

1. Technical Field

The present disclosure relates to a device for testing signals of a circuit board.

2. Description of Related Art

A signal test device is used to test signals of a motherboard. The signal test device is connected to the motherboard and includes sub-miniature-A (SMA) connectors. The signal test device is connected to an oscilloscope via cables with the SMA connectors, to display the signal of the motherboard. The SMA connectors of the signal test device are connected to the SMA connectors of the oscilloscope by threads, thus a wrench is used to connect the SMA connectors of the cables to the SMA connectors of the signal test device. If an operator accidentally applies too much force on the wrench, the SMA connectors and a circuit board of the signal test device may be damaged.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one."

Figure 1:
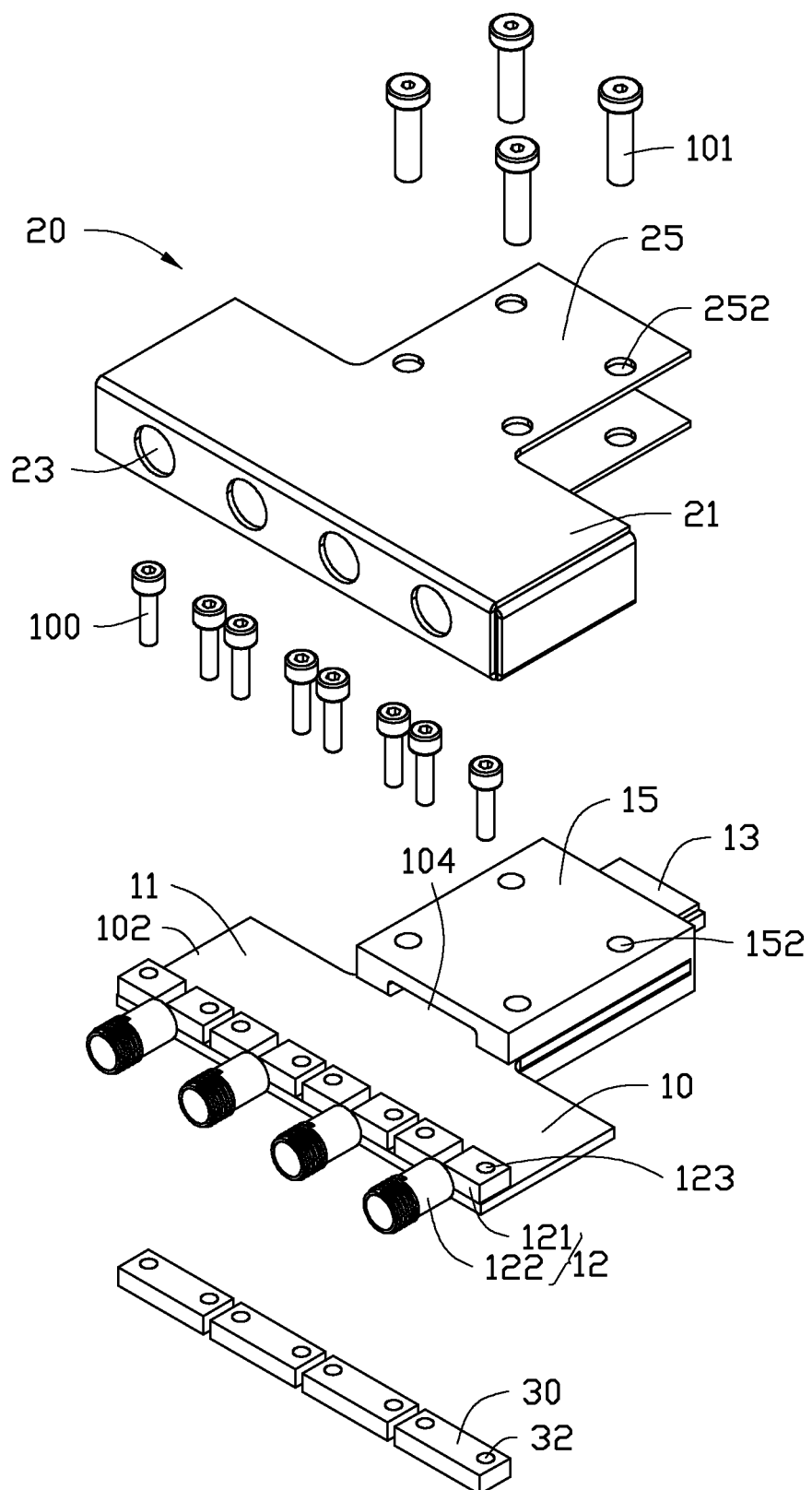
FIG. 1 is an exploded, isometric view of an embodiment of a signal test device, wherein the signal test device includes a metal housing.

FIG. 1 shows an exemplary embodiment of a signal test device. The signal test device includes a circuit board 10, a housing 20 with high intensity such as, high-intensity metal, and four cushion blocks 30.

The circuit board 10 is substantially T-shaped, and includes a rectangular first portion 102, and a rectangular second portion 104 perpendicularly extending from a middle of a first side of the first portion 102. Four sub-miniature-A (SMA) connectors 12 are electrically connected to the circuit board 10. Each SMA connector 12 includes a base body 121 attached to one of the two opposite surfaces 11 of the circuit board 10 and located at a second side of the first portion 102 opposite to the second portion 104, and a threaded connection head 122 extending from the base body 121 and beyond the second side of the first portion 102. The base body 121 defines two through holes 123 extending through the base body 121 and the circuit board 10. The through holes 123 are perpendicular to the circuit board 10. An interface 13, such as a serial attached small computer system interface (SAS) interface or a serial advanced technology attachment (SATA) interface, is mounted to a distal end of the second portion 104 opposite to the first portion 102. A protection housing 15 is mounted to the circuit board 10, enclosing the second portion 104. The interface 13 is partially received in the protection housing 15. A plurality of mounting holes 152 are defined in the protection housing 15, perpendicular to the circuit board 10 and extending through the protection housing 15 and the circuit board 10.

Figure 2:
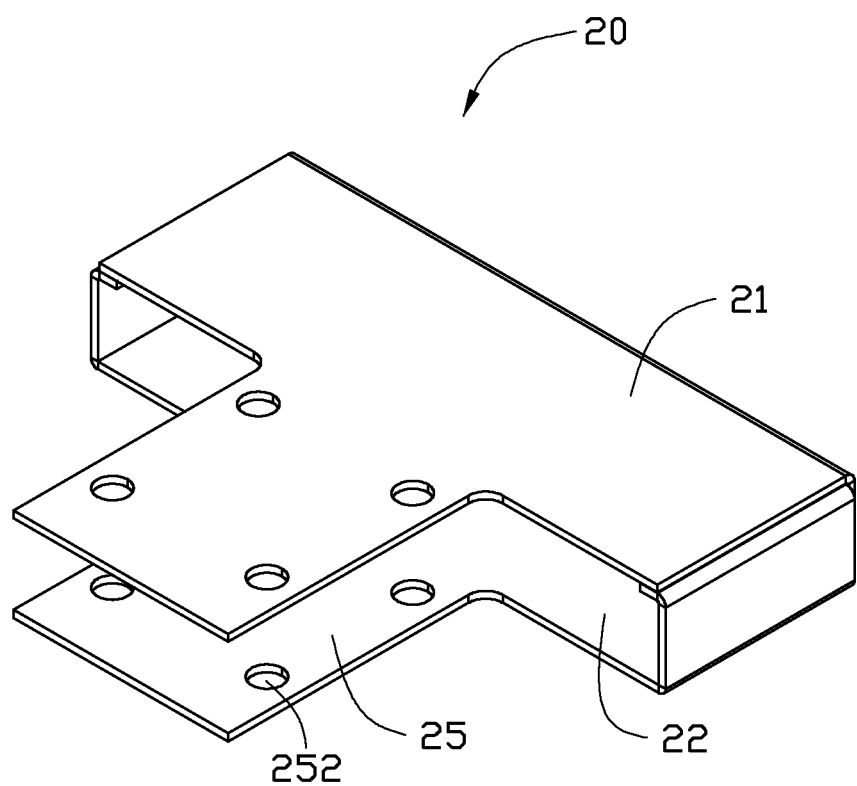
FIG. 2 is an enlarged view of the housing of FIG. 1, but viewed from another perspective.

FIG. 2 shows the housing 20 including a box-shaped main body 21. An opening 22 is defined in a side of the main body 21. The main body 21 defines four through holes 23 in a second side of the main body 21 opposite to the opening 22. Two mounting tabs 25 extend from top and bottom sides of the main body 21 bounding the opening 22. Each mounting tab 25 defines a plurality of through holes 252.

Each cushion block 30 defines two locking holes 32.

Figure 3:
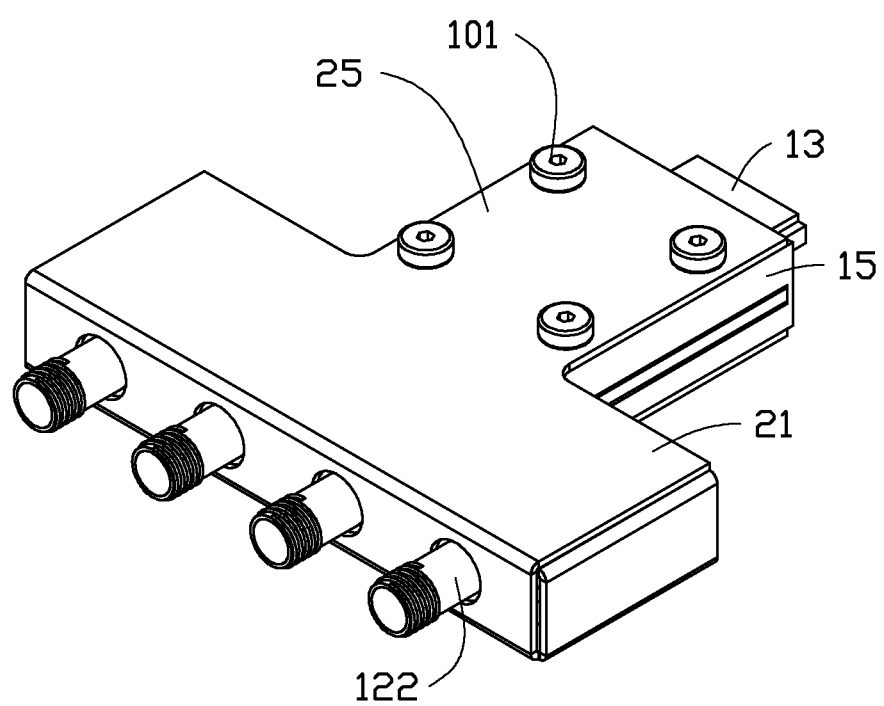
FIG. 3 is an assembled, isometric view of FIG. 1.

FIG. 3 shows in assembly. The cushion blocks 30 are placed on the other surface 11, respectively aligning with the base bodies 121. Eight fasteners 100, such as screws, extend through the through holes 123, then screw in and extend out of the locking holes 32. The circuit board 10 is received in the metal housing 20 through the opening 22. The connection heads 122 respectively extend through the through holes 23. Opposite ends of each fastener 100 abut against an inner surface of the main body 21. The protection housing 15 is sandwiched between the mounting tabs 25. A plurality of fasteners 101, such as screws, extends through the through holes 252 of one of the mounting tabs 25, screw in and extend through the mounting holes 152, and then engage in the through holes 252 of the other mounting tab 25.

Figure 4:
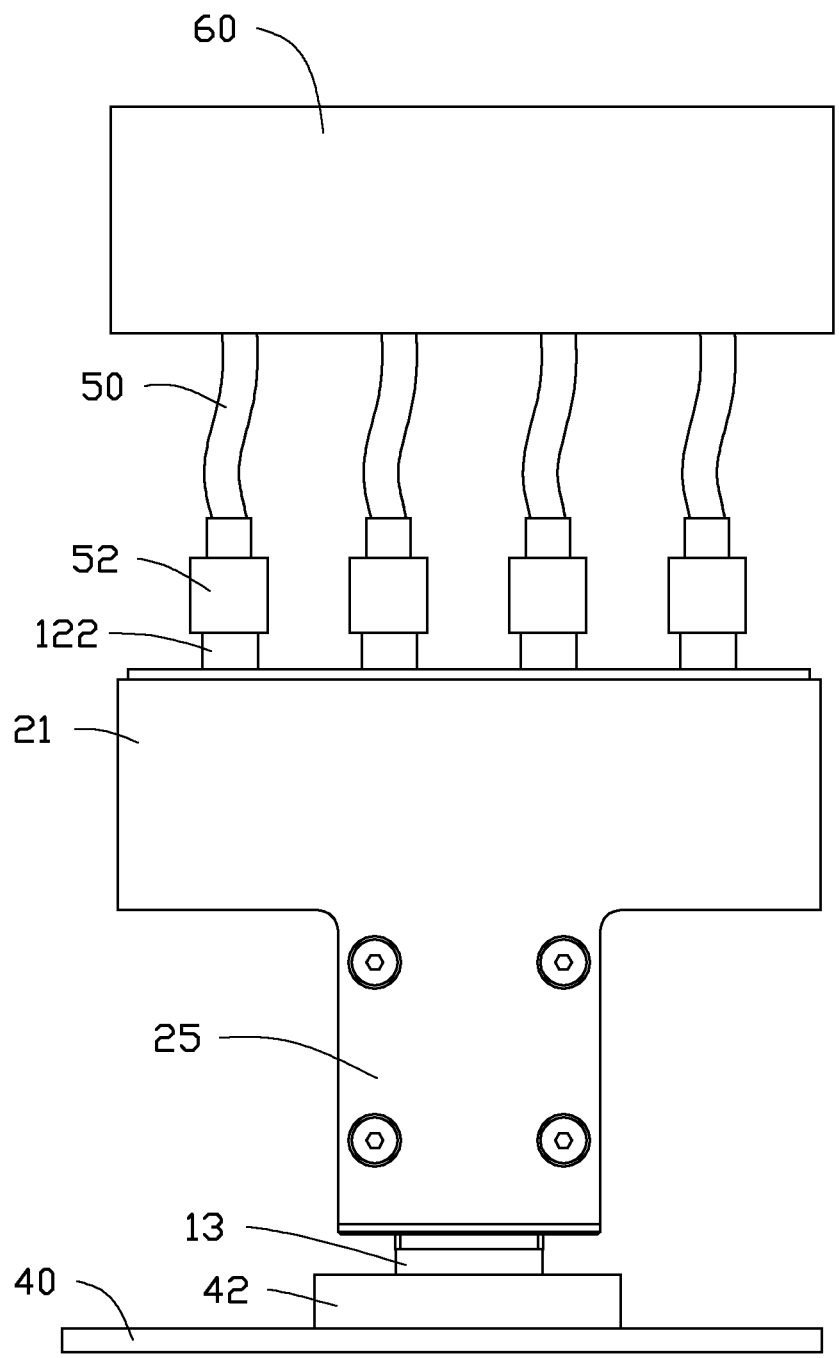
FIG. 4 is a top plan view of a state of use of the signal test device of FIG. 3.

FIG. 4 shows in use. The interface 13 is electrically connected to a corresponding type of interface 42 of a circuit board 40 of an electronic device. Four SMA connectors 52 located at first ends of four cables 50 respectively connected to the connection heads 122. Second ends of the cables 50 are electrically connected to an oscilloscope 60, to display signals of the circuit board 40.

The housing 20 abuts against opposite ends of the fasteners 100, to strengthen the intensity of the circuit board 10. When the SMA connectors 52 are connected to the SMA connectors 12 by a wrench, the force applied on the circuit board 10 and the SMA connectors 12 is partially burdened by the metal housing 20. In the embodiment, a height of each cushion block 30 is the same as a height of each base body 121, to balance the force applied on opposite sides of the circuit board 10.

Even though numerous characteristics and advantages of the embodiments have been set forth in the foregoing description, together with details of the structure and the functions of the embodiments, the disclosure is illustrative only, and changes may be made in details, especially in the matters of shape, size, and arrangement of parts within the principles of the embodiments to th e full extent indicated by the broad general meaning of the terms in which the appended claims are expressed.

What is claimed is:

1. A signal test device, comprising:
   a housing;
   a circuit board received in the housing;
   a plurality of sub-miniature-A (SMA) connectors connected to a first side of the circuit board, each SMA connector comprising a base body mounted to the circuit board, and a connection head extending from the base body and extending out of the housing;
   an interface connected to a second side of the circuit board and extending out of the housing;

a protection housing mounted to the second side of the circuit board and received in the housing; and a plurality of first fasteners extending through and fastened to the base bodies and the circuit board, opposite ends of each first fastener abutting against top and bottom of the inner surface of the housing.

2. The signal test device of claim 1, wherein the base bodies are connected to a first surface of the circuit board, a plurality of cushion blocks is placed on a second surface of the circuit board opposite to the first surface and aligning with the base bodies, the plurality of first fasteners extends through the base bodies and the circuit board, and screws in and extend outs of the plurality of cushion blocks.

3. The signal test device of claim 2, wherein a height of each cushion block is the same as a height of each base body.

4. The signal test device of claim 1, wherein the housing comprises a main body, an opening is defined in a side of the main body for allowing the circuit board to enter the main body, the main body defines a plurality of through holes opposite to the opening, the plurality of connection heads extends out of the metal housing through the plurality of through holes, opposite ends of each first fastener abut against top and bottom of an inner surface of the main body.

5. The signal test device of claim 4, wherein two mounting tabs extend from opposite sides of the main body bounding the opening, the protection housing is fastened to the mounting tabs.

6. The signal test device of claim 5, wherein a plurality of second fasteners extends through one of the mounting tabs, screws in and extends out of the protection housing and the circuit board, and engages in the other mounting tab.

7. The signal test device of claim 1, wherein the housing is made of high-intensity metal.

* * * * *